(12) United States Patent
Song et al.

(10) Patent No.: US 8,008,212 B2
(45) Date of Patent: Aug. 30, 2011

(54) FABRICATION METHODS FOR INTEGRATION CMOS AND BJT DEVICES

(75) Inventors: Chien-Hsien Song, Kaohsiung (TW); Yung-Lung Chou, Hsinchu (TW); Yu-Hsun Chen, Changhua County (TW); Cheng-Che Tsai, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 451 days.

(21) Appl. No.: 12/323,404

(22) Filed: Nov. 25, 2008

(65) Prior Publication Data

US 2010/0041233 A1    Feb. 18, 2010

(30) Foreign Application Priority Data

Aug. 12, 2008 (TW) .............................. 97130647 A

(51) Int. Cl.
    *H01L 21/302* (2006.01)
(52) U.S. Cl. ......... 438/723; 438/706; 438/724; 438/756
(58) Field of Classification Search .................. 438/706, 438/710, 712, 720, 595, 723, 724, 756
See application file for complete search history.

(56) References Cited

U.S. PATENT DOCUMENTS

| 5,273,915 A * | 12/1993 | Hwang et al. ................. 438/155 |
| 2007/0099406 A1* | 5/2007 | Higashi et al. ................. 438/585 |
| 2008/0003745 A1* | 1/2008 | Myung et al. ................. 438/257 |

FOREIGN PATENT DOCUMENTS

CN        101635279 A        1/2010

* cited by examiner

*Primary Examiner* — Lan Vinh

(57) ABSTRACT

Fabrication methods for integrating CMOS and BJT devices are presented. A semiconductor substrate having a first region and a second region are provided, wherein the first region includes a CMOS device, and the second region includes a BJT device. A dielectric layer is conformably deposited on the semiconductor substrate. Part of the dielectric layer is removed, thereby forming sidewall spacers on a gate structure of the CMOS device and remaining a thin dielectric layer on the BJT device. The remaining thin dielectric layer is completely removed, completing integration of the CMOS device and the BJT device.

6 Claims, 7 Drawing Sheets

US 8,008,212 B2

FABRICATION METHODS FOR INTEGRATION CMOS AND BJT DEVICES

BACKGROUND OF THE INVENTION

CROSS REFERENCE TO RELATED APPLICATIONS

This application is based upon and claims the benefit of priority from a prior Taiwanese Patent Application No. 097130647, filed on Aug. 12, 2008, the entire contents of which are incorporated herein by reference.

1. Field of the Invention

The invention relates to semiconductor devices and fabrication methods thereof and in particular, to fabrication methods for integrating a CMOS and BJT device.

2. Description of the Related Art

One conventional fabrication method for integrating circuits includes integrating a complimentary metal oxide semiconductor (CMOS) transistor and (bipolar junction transistor) BJT device. Note that the characteristics of both the CMOS and BJT device have to be considered when designed in a single chip, and must not interfere with each other. For example, during a conventional etching process for the gate spacer of the CMOS device, surfaces of the BJT device may be damaged due to etching power or over etching, thereby resulting in incremental current leakage.

FIG. 1 is a cross section schematically illustrating conventional integration of a CMOS and BJT device. Referring to FIG. 1, a semiconductor substrate 1 is divided into two regions I and II. In region I, a CMOS transistor device 10 is formed on the semiconductor substrate 1. In region II, a BJT device 20 is formed on the semiconductor substrate. The CMOS transistor device includes a gate dielectric 13, a polysilicon gate 14 and a tungsten silicide gate 15 on the semiconductor substrate 1. Source and drain doped regions 11 and 12 are formed by the semiconductor substrate 1. The source and drain doped regions 11 and 12 of the CMOS device 10 and p-type well doped region 22, N-type doped region 24, and p-type heavy doped region 26 are formed by the same ion-implanting and diffusion processes.

Subsequently, spacers 16 are formed on both the sidewalls of the gate structure of the CMOS device 10. For example, an oxide layer is etched by a reactive ion etching process E, and spacers 16 on the sidewalls of the gate structure are formed. However, the reactive ion etching process is performed by bombardment of high power reactive ions. Thus, in order to prevent silicon oxide residue on the semiconductor substrate, over etching occurs, resulting in defects or surface damage 30 on the BJT device 20, causing incremental current leakage.

BRIEF SUMMARY OF THE INVENTION

Accordingly, in order to overcome the above-mentioned drawbacks of the background art, the processing characteristics of a CMOS and BJT device have to be considered when integrating CMOS and BJT devices. Therefore, embodiments of the invention provide fabrication methods for integrating CMOS and BJT devices to prevent current leakage in the BJT device and to improve production yields.

One embodiment of the invention provides a fabrication method for integrating CMOS and BJT devices, comprising: providing a semiconductor substrate having a first region and a second region, wherein the first region comprises a CMOS device, and wherein the second region comprises a BJT device. Additionally, a dielectric layer on the semiconductor substrate is conformably deposited and a portion of the dielectric layer is removed, thereby creating sidewall spacers on a gate structure of the CMOS device and leaving a thin dielectric layer on the BJT device. Lastly, the remaining thin dielectric layer is removed, thus completing integration of the CMOS and the BJT device.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
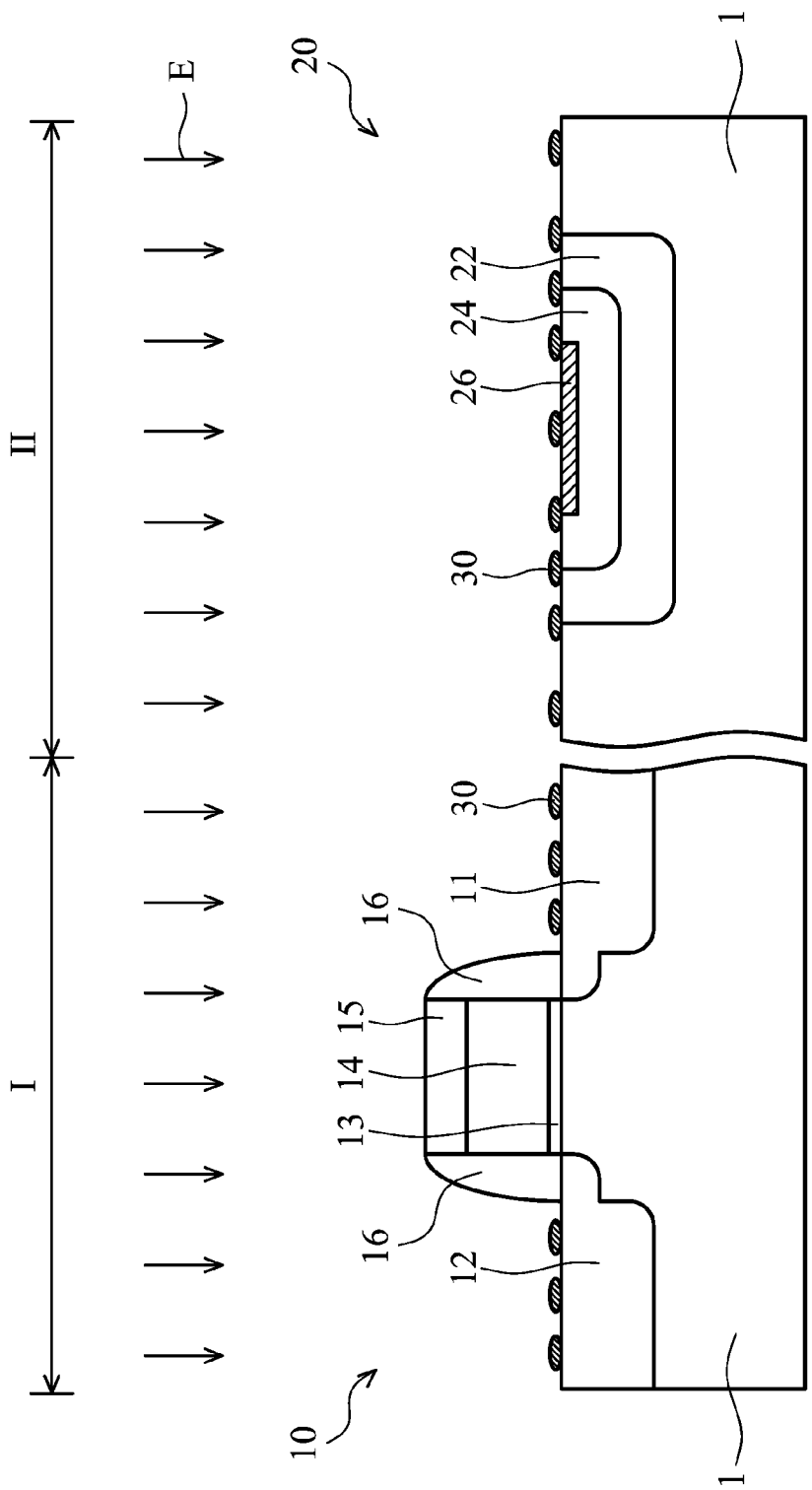
FIG. 1 is a cross section schematically illustrating conventional integration of a CMOS and BJT device.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation method for a first feature over or on a second feature in the description that follows may include embodiments in which the first and second features are formed in direct contact or not in direct contact.

Figure 2A:
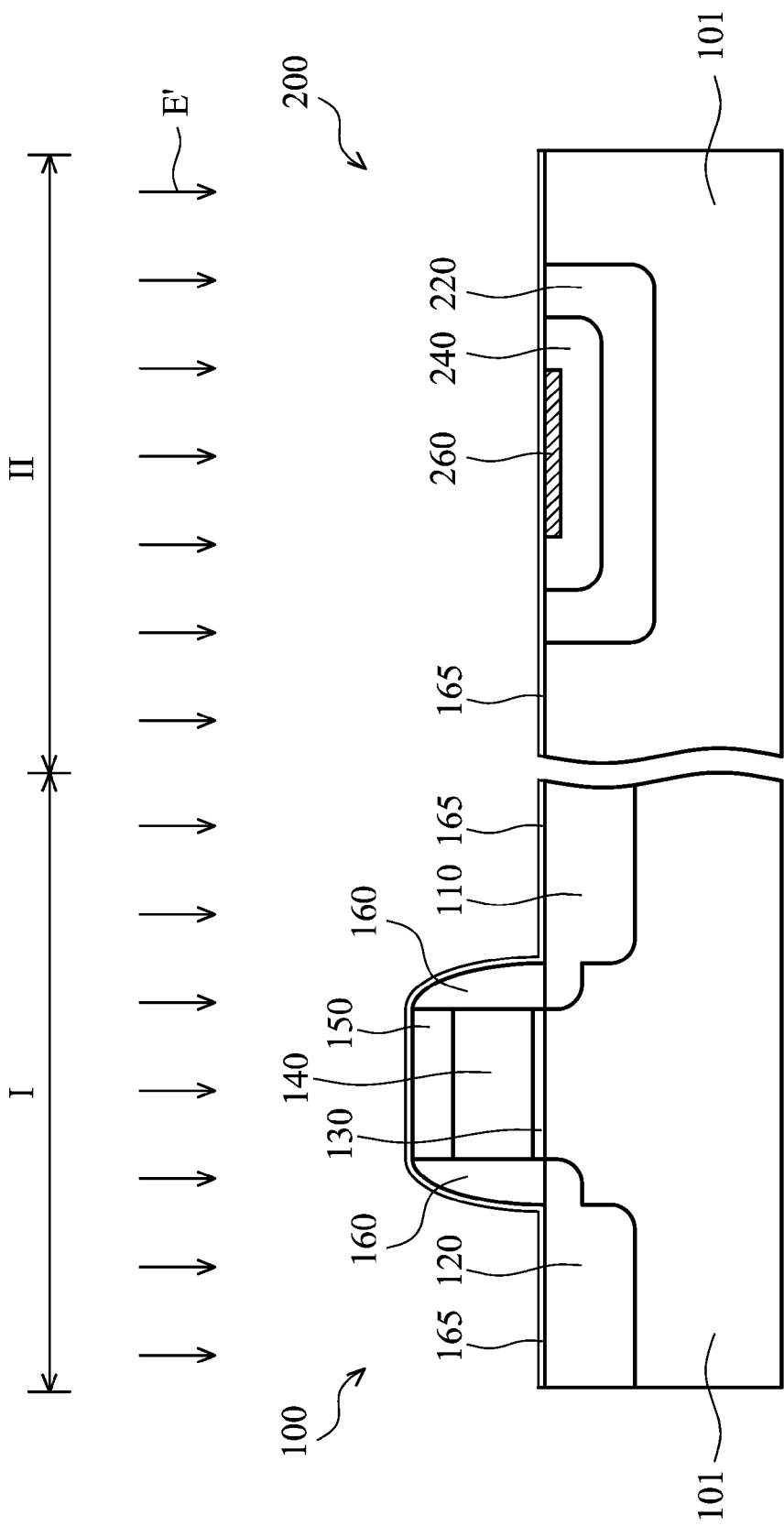
FIGS. 2A-2B are cross sections illustrating each step of an embodiment of a fabrication method for integrating the CMOS and BJT device.
Figure 2B:
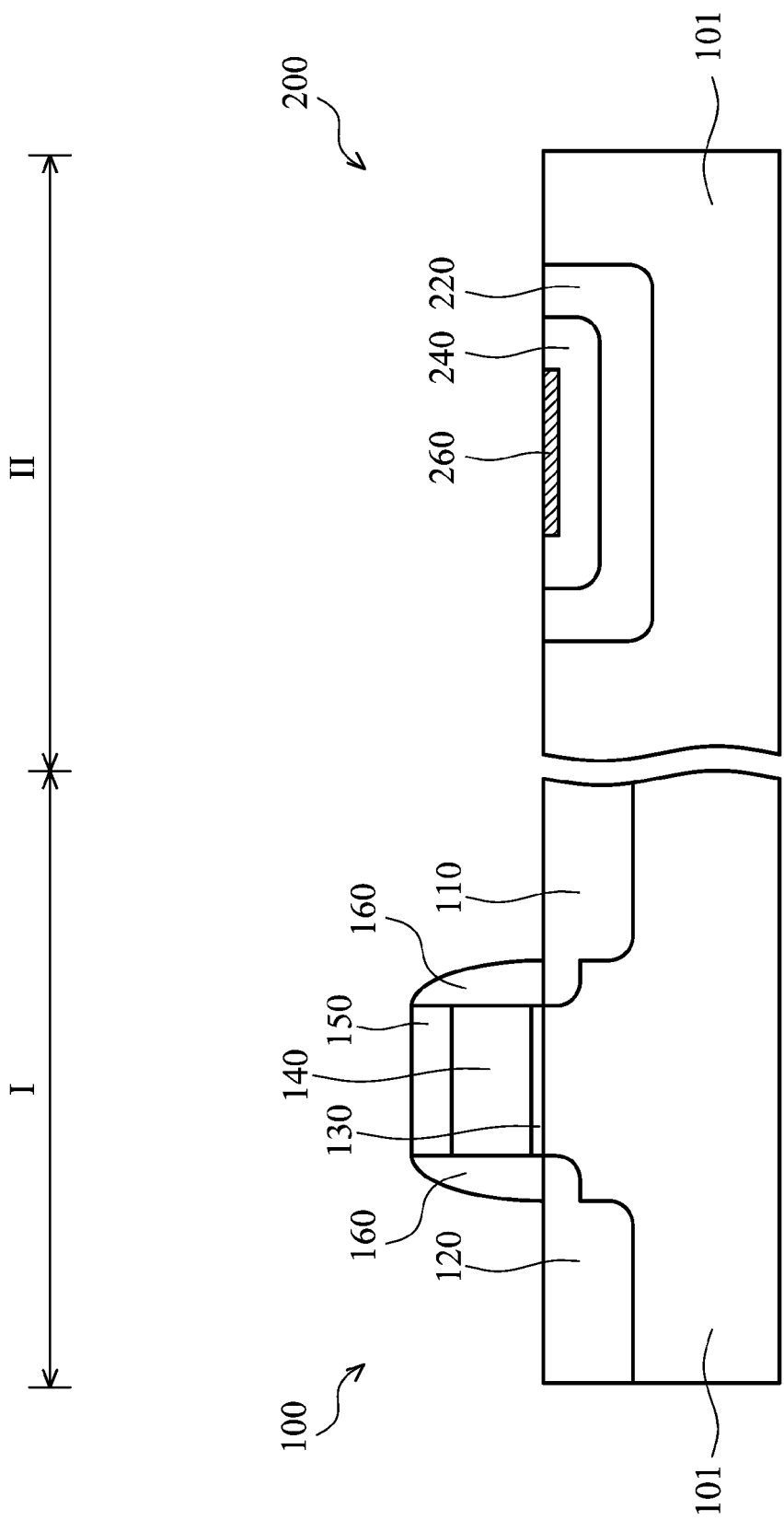

FIGS. 2A-2B are cross sections illustrating each step of an embodiment of a fabrication method for integrating of the CMOS and BJT device.

Referring to FIG. 2A, a semiconductor substrate 101 is provided. The semiconductor substrate 101 can include a single crystalline silicon substrate, a silicon-on-sapphire (SOS) substrate, or a silicon-on-insulator (SOI) substrate. The semiconductor substrate 101 can be divided into two regions I and II. In region I, a CMOS transistor device 100 is formed on the semiconductor substrate 1. In region II, a BJT device 200 is formed on the semiconductor substrate. The CMOS transistor device includes a gate dielectric 130, a polysilicon gate 140 and a metal silicide (e.g., tungsten silicide WSi) gate 150 on the semiconductor substrate 101. Source and drain (S/D) doped regions 110 and 120 are formed in the semiconductor substrate 101. The source and drain (S/D) doped regions 110 and 120 of the CMOS device 100 and p-type well doped region 220, N-type doped region 240, and p-type heavy doped region 260 of the BJT device 200 are formed by the same ion-implanting and diffusion processes.

Subsequently, a dielectric layer (such as a silicon oxide layer) is conformably formed on the semiconductor substrate 101 covering the CMOS and BJT devices. A low-power reactive ion etching E', which is relatively 70% lower in power than conventional etching, is performed, or the etching rate is controlled such that spacers 160 are formed on both the sidewalls of the gate structure of the CMOS device 100, leaving an ultra-thin dielectric (silicon oxide) layer 165.

Referring to FIG. 2B, the remaining ultra-thin dielectric (silicon oxide) layer 165 is then removed by wet etching or by plasma ashing. Since both the wet etching and plasma ashing processes are relatively less corrosive than the conventional reactive ion etching process, surface of the BJT device 200 is not damaged during the reactive ion etching process, thereby preventing current leakage in the BJT device.

Note that in one embodiment of the invention the CMOS device of the first region comprises a logic operation device and the BJT device of the second region comprises a high voltage power supply device.

Figure 3A:
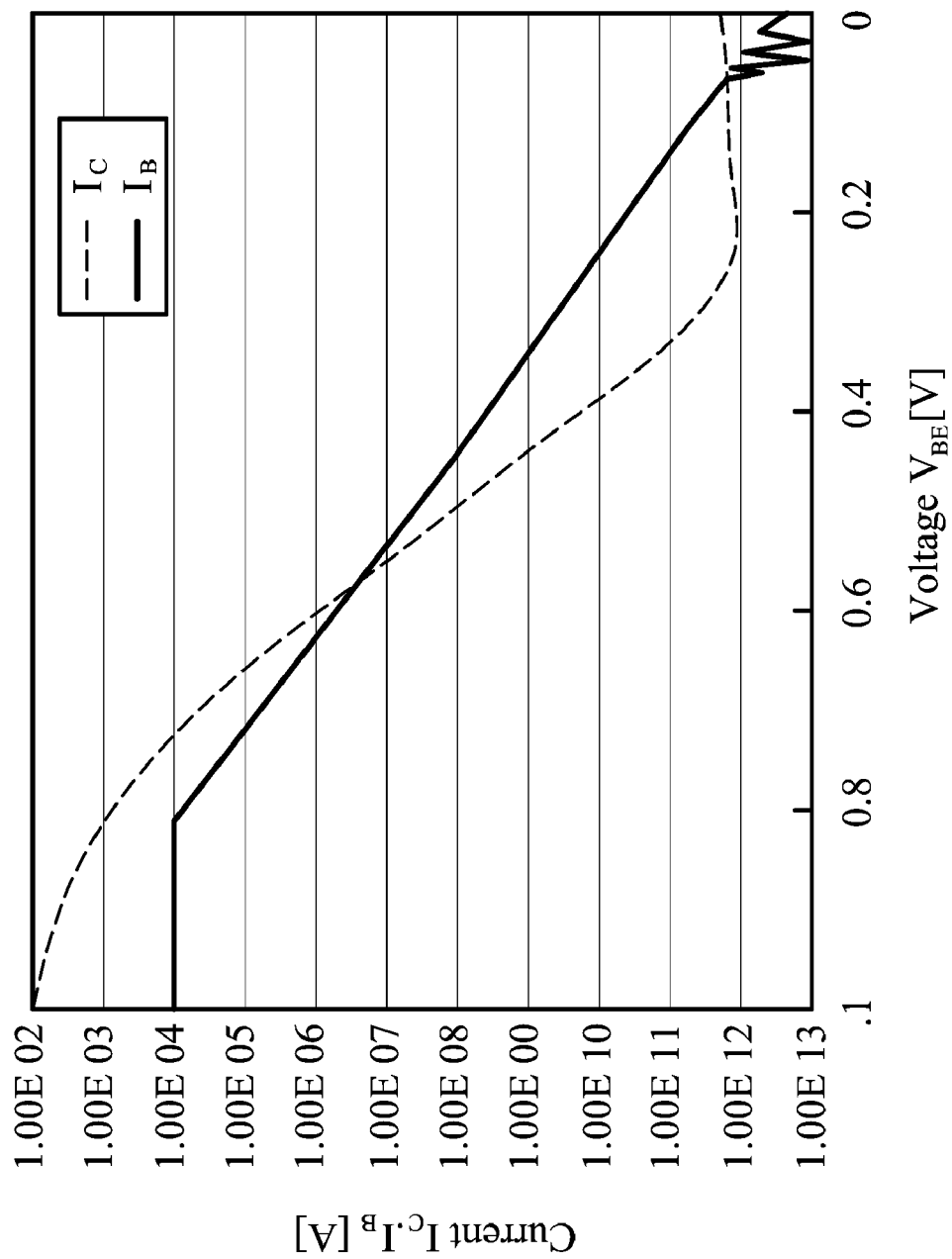
FIGS. 3A-3D are schematic diagrams illustrating curved relationships between operating voltage and current of the BJT device.
Figure 3B:
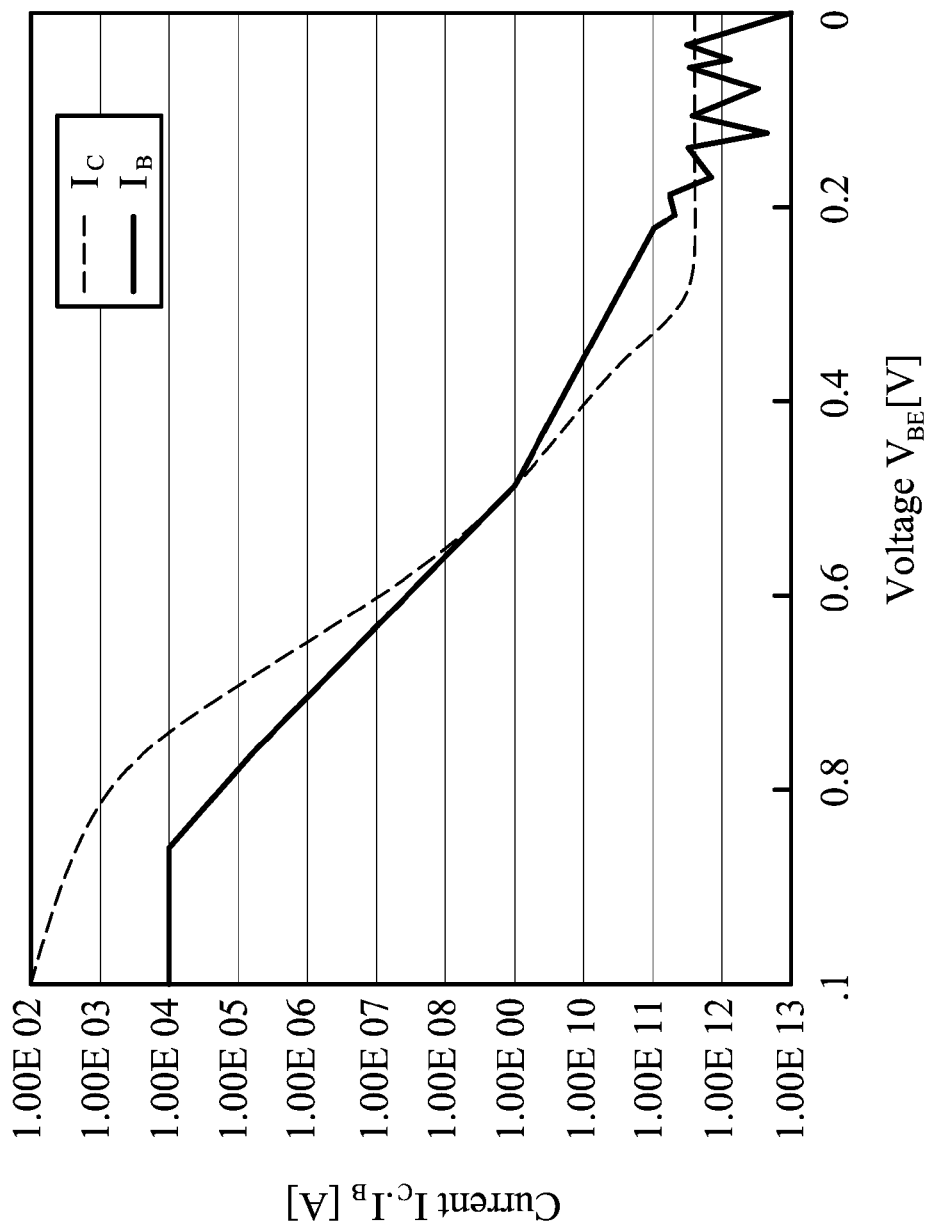
Figure 3C:
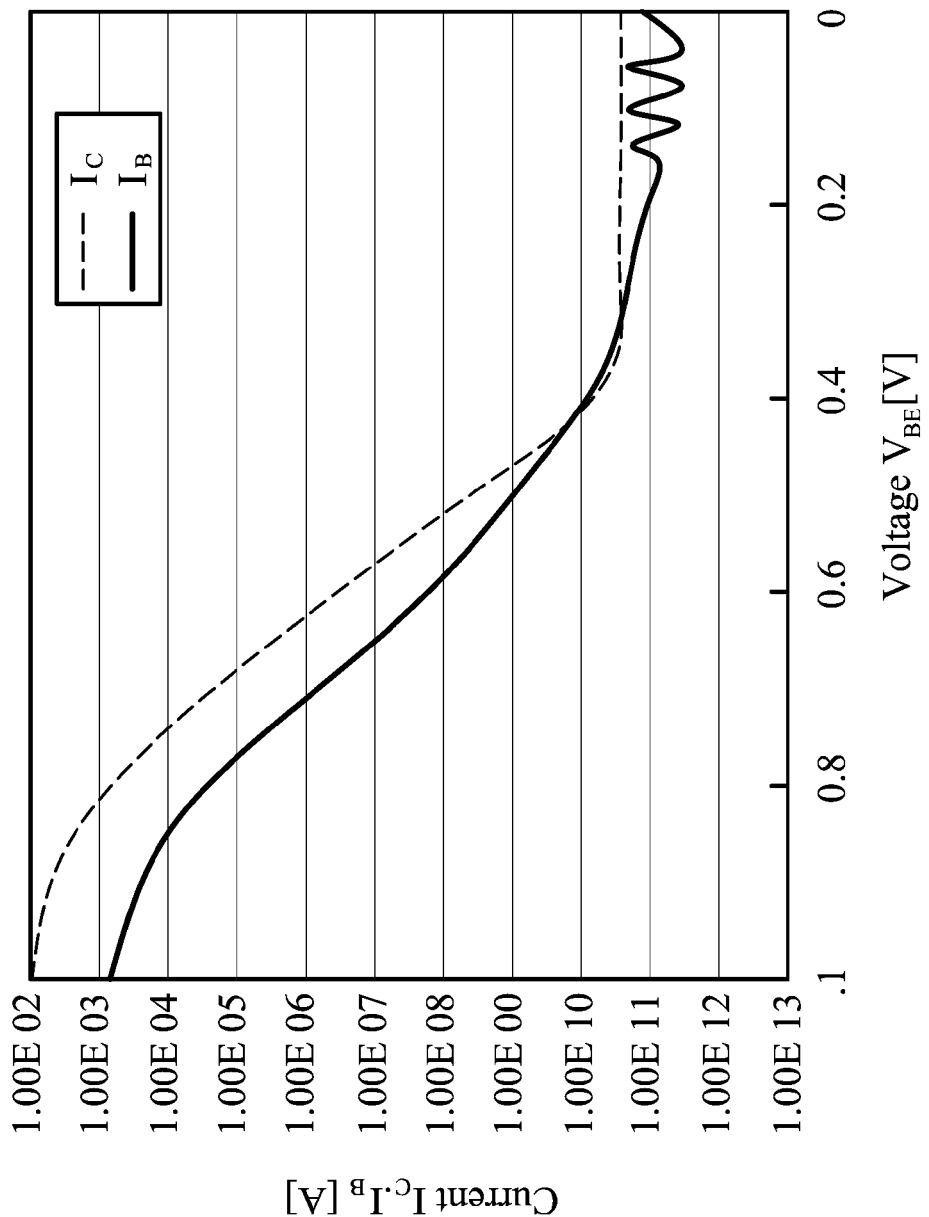
Figure 3D:
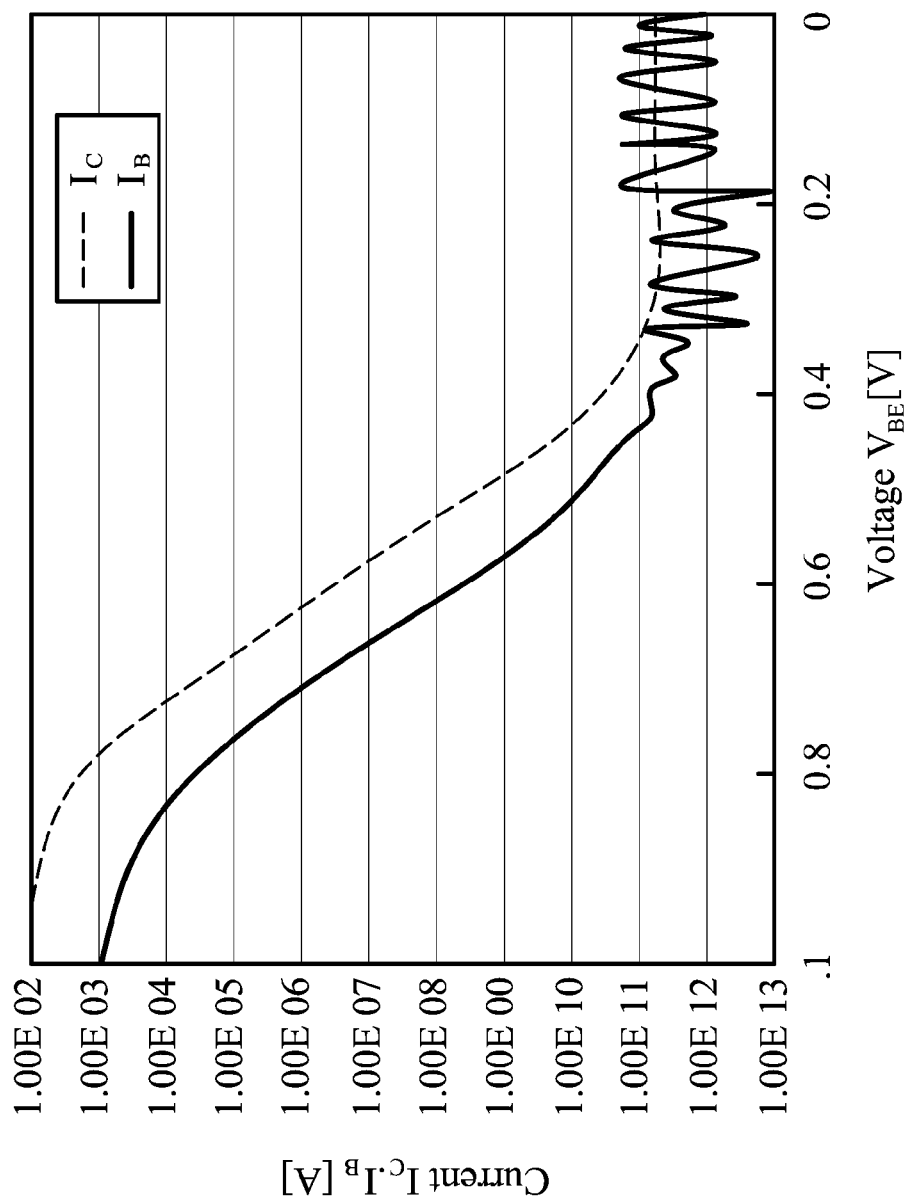

FIGS. 3A-3D are schematic diagrams illustrating curved relationships between operating voltage and current of the BJT device. As shown in FIGS. 3A-3D, surface damage on the BJT device can be prevented by reducing biasing (power) of the reactive ion etching process or reducing over-etching time during formation of the gate spacers, thereby hindering initial base leakage current (IB) problems. Moreover, when comparing FIGS. 3A-3D, its is shown that the initial base leakage current (IB) problems have been effectively addressed by reducing 30% bias (power) of the reactive ion etching process without over-etching, as shown in FIG. 3D.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for integrating CMOS and BJT devices, comprising:
   providing a semiconductor substrate having a first region and a second region, wherein the first region comprises a CMOS device, and wherein the second region comprises a BJT device;
   conformably depositing a dielectric layer on the semiconductor substrate;
   removing a portion of the dielectric layer, thereby creating sidewall spacers on a gate structure of the CMOS device and leaving a thin film portion of the dielectric layer on the BJT device; and
   completely removing the thin film portion of the dielectric layer such that integration of the CMOS device and the BJT device is completed.

2. The fabrication method as claimed in claim 1, wherein the gate structure of the CMOS device comprises a metal silicide gate structure.

3. The fabrication method as claimed in claim 2, wherein removal of the portion of the dielectric layer comprises removing part of the dielectric layer by a reactive ion etching process.

4. The fabrication method as claimed in claim 3, wherein the process of the reactive ion etching comprises a low-power reactive ion etching.

5. The fabrication method as claimed in claim 1, wherein the step of completely removing the remaining thin dielectric layer comprises removing the remaining thin dielectric layer by wet etching.

6. The fabrication method as claimed in claim 1, wherein the CMOS device of the first region comprises a logic operation device, and wherein the BJT device of the second region comprises a high voltage power supply device.

* * * * *